United States Patent [19]

Roth et al.

[11] 4,395,813

[45] Aug. 2, 1983

[54] PROCESS FOR FORMING IMPROVED SUPERCONDUCTOR/SEMICONDUCTOR JUNCTION STRUCTURES

[75] Inventors: John A. Roth; Lynette B. Roth, both of Oxnard, Calif.

[73] Assignee: Hughes Aircraft Company, El Segundo, Calif.

[21] Appl. No.: 199,163

[22] Filed: Oct. 22, 1980

[51] Int. Cl.³ .................... H01L 39/22; H01L 39/24; H01L 39/16

[52] U.S. Cl. ................................. 29/576 B; 29/573; 29/599; 148/1.5; 357/5; 357/15; 427/62; 427/84

[58] Field of Search ................ 357/5, 15; 427/62, 84; 29/573, 576 B, 599; 148/1.5

[56] References Cited

U.S. PATENT DOCUMENTS

| | | | |
|---|---|---|---|
| 3,761,310 | 9/1973 | Preobrazhentsev et al. | 427/89 |
| 3,794,516 | 2/1974 | Engeler et al. | 427/88 |
| 3,984,261 | 10/1976 | Hawrylo | 148/33 |
| 4,090,851 | 5/1978 | Berkman et al. | 156/608 X |
| 4,220,959 | 9/1980 | Kroger | 357/5 |

OTHER PUBLICATIONS

Roth, L. B. et al., "Super–Schottky and Josephson Effect Devices Using Niobium on Thin Silicon Membranes", in *Amer. Inst. of Phys.*, vol. 44, pp. 384–388, 1978.

*Primary Examiner*—L. Dewayne Rutledge
*Assistant Examiner*—Alan E. Schiavelli
*Attorney, Agent, or Firm*—Mary E. Lachman; A. W. Karambelas

[57] ABSTRACT

The specification discloses a process for forming a superconductor/semiconductor junction structure having optimized low-temperature current transport properties by first providing a substrate of a chosen semiconductor material having an atomically clean surface. A layer of a first chosen superconducting material is deposited on or above the surface of the substrate to a predetermined thickness. Either before or after the formation of this layer of the first superconducting material, a region of a second chosen superconducting material is formed between the surface of the substrate and the layer of the first superconducting material to serve as an interfacial reaction barrier to prevent the reaction between the surface of the substrate and the first chosen superconducting material at the interface thereof which would otherwise result in the formation of an undesired non-superconducting material at the interface. By preventing this undesired interfacial reaction, an optimized low-temperature current transport path is maintained across the interface and certain device performance characteristics can be optimized. Josephson junction superconducting devices and super-Schottky devices may be formed by this disclosed process.

9 Claims, 5 Drawing Figures

PROCESS FOR FORMING IMPROVED SUPERCONDUCTOR/SEMICONDUCTOR JUNCTION STRUCTURES

BACKGROUND OF THE INVENTION

1. Field of the Invention

This invention relates generally to a process for forming an improved superconductor/semiconductor junction structure, such as a Josephson junction device or a super-Schottky device, which has an interfacial reaction barrier, and to structures formed by such a process; and, more particularly, to a process for forming such a structure having silicon as the semiconductor and niobium as the first superconductor material, with a layer of second chosen superconducting material formed between the niobium and silicon.

2. Description of the Prior Art

Superconducting devices, such as Josephson junction devices and super-Schottky devices, are finding increased use in computer electronic circuits where fast switching speeds and low power dissipation levels are required and also in millimeter wave and microwave detection circuits and mixers where there are low noise requirements.

A Josephson junction superconducting structure of the tunnel-junction type is described in the publication entitled "Josephson Tunnel-Junction Electrode Materials," by C. J. Kircher and M. Murakami, in SCIENCE, Vol. 208, 23 May 1980, pages 944–950, and further in the publication entitled "The Superconducting Computer", by J. Matisoo, in *Scientific American,* Vol. 242, No. 5, May 1980, pages 50–65. Such a Josephson junction superconducting device may be composed of several superconducting tunneling junctions having shared common electrodes as shown in the publication by Kircher et al. The junction portion of the structure consists of two superconducting electrodes on either side of an ultra-thin insulating layer, which is sufficiently thin that super-current (i.e., zero voltage current) can pass through it by electron pair tunneling. The electrodes are formed of a superconductor material, that is, a metal that has an infinitesimally small electrical resistivity (i.e., zero resistivity) when cooled to below a characteristic temperature $T_c$, typically 20° K. or lower. In the prior art, the Josephson device has been fabricated using an oxide layer as the insulating layer which serves as a tunneling barrier.

However, we have recently shown that superconducting Josephson junction devices can be fabricated using an ultra-thin silicon membrane as the tunneling barrier, and niobium (Nb) as the superconductor electrode, as described in the publication entitled "Super-Schottky and Josephson Effect Devices Using Niobium on Thin Silicon Membranes," by Lynette B. Roth, John A. Roth, and Paul M. Schwartz, in *Future Trends in Superconducting Microelectronics, American Institute of Physics Proceedings,* Vol. 44, edited by B. S. Deaver, C. M. Falco, J. H. Harris, and S. A. Wolf, New York, 1978, pages 384–388. The use of a silicon substrate rather than an oxide layer as the tunneling barrier in a Josephson junction device has the advantage that the silicon barrier can be 10 to 100 times thicker than the equivalent oxide barrier, which permits greater ease of fabrication. Moreover, all the capabilities of the highly developed processing technology for silicon may be used. In addition, the use of silicon barriers in Josephson junction devices permits the operating characterics of these devices to be optimized for each particular application by modifying the doping profile within the silicon.

A super-Schottky device is somewhat similar in structure to the Josephson junction superconducting device discussed above, in that a super-Schottky device also has a superconductor/semiconductor junction. The structure and function of a super-Schottky device is described, for example, in the publication by F. L. Vernon, Jr., M. F. Millea, M. F. Bottjer, A. J. Silver, R. J. Pedersen, and M. McColl, IEEE MTT-25,286 (1977). Basically, a super-Schottky device consists of a semiconductor layer, such as silicon, on one surface of which is formed a superconductor layer, such as niobium, to provide an interface therebetween which is the site of the Schottky barrier. On the opposite surface of the semiconductor layer there is formed a layer of a conventional metal, such as aluminum.

In both the super-Schottky device and the super-conducting Josephson junction devices, in which there are superconductor/semiconductor junctions, and which are thus referred to herein as superconductor/semiconductor junction structures, device performance is highly sensitive to the precise electronic structure of the superconductor/semiconductor interface since the low temperature current transport in these two types of devices occurs by super-conductive quasi-particle or electron pair tunneling, respectively. Specifically, the presence of non-superconducting or low $T_c$ compounds at the superconductor/semiconductor interface results in spurious electronic states that permit unwanted currents to flow in the device. For example, such excess currents degrade (i.e., decrease) the voltage-state resistance of Josephson junction logic gates and increase the noise figure of super-Schottky mixers. Therefore, the successful development of super-conducting devices using Nb/Si or other superconductor/semiconductor junctions requires certain control over the nature and extent of interfacial chemical reactions which may alter the electronic structure in these systems. This control is especially important for certain transition-metals, such as niobium or vanadium, which are known to readily form silicides when in intimate contact with silicon.

Consequently, we have studied the superconductor/semiconductor interface of selected transition metals that can potentially have interfacial reactions with silicon in order to establish the extent and morphology of interfacial compound formation. As described in our publication entitled "Interface Structure and Electrical Behavior of Nb/Si Junctions," by John A. Roth and Lynette B. Roth, in the *Electrochemical Society Proceedings of the Symposium on Thin Film Interfaces and Interactions,* edited by John E. E. Baglin and John M. Poate, Vol. 80-2, (1980) pages 111–121, we found that a laterally non-uniform niobium silicide ($NbSi_2$) layer, having an average thickness of 15 angstroms, forms without intentional heating in Nb/Si samples prepared by deposition of niobium onto atomically clean silicon under ultra-high vacuum, as determined from Auger spectroscopy line shape analysis. Some silicide formation can be expected in any clean transition-metal/Si interface since the heat of condensation of the deposited metal will generally be sufficient to overcome any reaction barriers. In particular, in the Nb/Si system, silicides nucleate and grow during metal deposition, particularly when an atomically clean substrate surface is provided. Such is the case in the ultra-high vacuum deposition of niobium, as employed in some prior art processes in order to achieve good junction formation. The disadvantage of these interfacial reactions is that the compounds so formed are usually non-superconductor materials or low $T_c$ superconductor materials at best, and thus they degrade the superconducting properties and consequent performance of the device, as previously discussed herein.

It is the alleviation of this problem of the formation of unwanted interfacial reaction products in superconductor/semiconductor junction devices to which the present invention is directed. To the best of our knowledge, we believe that we are the first to recognize the problem caused by these interfacial reactions and to provide a solution thereto.

SUMMARY OF THE INVENTION

The general purpose of this invention is to provide a new and improved process for forming a superconductor/semiconductor junction structure and the new and improved structures formed by such a process which possess most, if not all, of the advantages of the prior art processes for forming such superconducting structures and the structures formed by such processes, while alleviating their disadvantages discussed above.

In order to accomplish the above-described general purpose of this invention, we have discovered and developed a new and improved process for forming a superconductor/semiconductor junction structure having optimized low-temperature current transport properties by first providing a substrate of a chosen semiconductor material having an atomically clean surface. A layer of a first chosen superconducting material is deposited on or above the surface of the substrate to a predetermined thickness. Either before or after the formation of this layer of the first superconducting material, a region of a second chosen superconducting material is formed between the surface of the substrate and the layer of the first superconducting material to serve as an interfacial reaction barrier to prevent the reaction between the surface of the substrate and the first chosen superconducting material at the interface thereof which would otherwise result in the formation of an undesired non-superconducting material at the interface. By preventing this undesired interfacial reaction, an optimized low-temperature current transport path is maintained across the interface.

Accordingly, one purpose of the present invention is to provide a new and improved process for forming a superconductor/semiconductor junction structure having optimized low-temperature current transport properties and improved current-voltage characteristics.

Another purpose of the present invention is to provide a process of the type described in which the formation of an undesired non-superconducting material at the interface of the substrate and superconductor is prevented by providing an interfacial reaction barrier.

One feature of the present invention is that the required interfacial reaction barrier may be formed by depositing a second selected superconducting material between the substrate and the first selected superconducting material.

Another feature of the present invention is that the required interfacial reaction barrier may be formed by depositing between the substrate and the first chosen superconducting material a selected reactive material which is capable of undergoing an interfacial reaction with the first chosen superconducting material or with the semiconductor substrate to form a second superconducting material.

Sill another feature of the present invention is that the required interfacial reaction barrier may be formed by altering the clean interface of the substrate and the first superconducting material by external perturbation to cause the formation of a layer of a second selected superconducting material at the interface of the substrate and the first superconducting material.

A further purpose of the present invention is to provide a new and improved superconductor/semiconductor junction structure having optimized low temperature current transport properties and improved current-voltage characteristics.

Another purpose is to provide a new and improved super-Schottky device.

Still another purpose is to provide a new and improved Josephson-junction device.

These and other advantages and features of the present invention will become more readily apparent in the following description of the drawings and the preferred embodiments of the invention.

DETAILED DESCRIPTION OF THE INVENTION

Figure 1A:
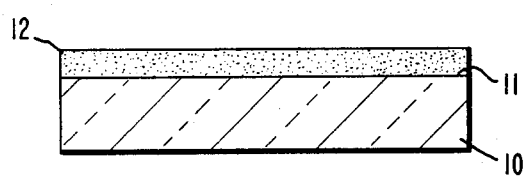
FIGS. 1a–c illustrate, in schematic form, some of the major steps in one process embodiment of the present invention.

FIG. 1 shows, in schematic form some of the major steps in one process embodiment of the present invention, in which there is deposited between the substrate and the first superconductor material a chosen reactive material which is capable of undergoing an interfacial reaction with the first superconductor material to form an additional superconductor material. First, a substrate 10 of a chosen semiconductor material, such as silicon, being formed, for example, as an ultra-thin (e.g., 100–4000 Å) membrane as shown in FIG. 1, is cleaned to provide an atomically clean surface 11 as shown in FIG. 1a. (The term "atomically clean surface" is used herein to describe a surface which is substantially free of foreign atoms, at least within the detection limits of a sensitive detection means such as Auger spectroscopy.) The surface 11 of the substrate 10 may be prepared by ion bombardment with inert ions such as argon, to remove a predetermined amount of material at the substrate surface, using known ion bombardment techniques as described, for example, in the publication by H. E. Farnsworth, R. E. Schlier, T. H. George, and R. M. Burger, in the *Journal of Applied Physics*, Vol. 29, 1958, p. 1150 et seq. This sputter-cleaning is performed within the ultra-high vacuum chamber in order to maintain the substrate under non-contaminating conditions. Next, a layer 12 of a chosen reactive material, such as carbon, which is capable of undergoing an interfacial reaction with a first chosen superconducting material (described below) to form a second chosen superconducting material, is deposited on the atomically clean surface 11 of the substrate 10 as shown in FIG. 1a. The layer 12 shown in FIG. 1a is deposited to a predetermined thickness, for example 10–50 angstroms for carbon deposited on silicon. The layer 12 is formed to be thick enough so that the interfacial reaction barrier formed therefrom (as discussed below) is a continuous layer without openings therein, but thin enough so that the interfacial reaction barrier formed therefrom does not dominate and determine the electrical properties of the device being formed.

The deposition of the layer 12 of the chosen reactive material is performed under ultra-high vacuum conditions in order to maintain the substrate 10 under non-contaminating conditions. The layer 12 may be formed of carbon, and may be deposited by electron bombardment of a graphite hearth liner placed in an electron beam evaporator using known electron beam evaporation techniques as described, for example, in the book by R. W. Berry, P. M. Hall, and M. T. Harris, entitled "Thin Film Technology," Van Nostrand, Princeton, New York, 1968.

Figure 1B:
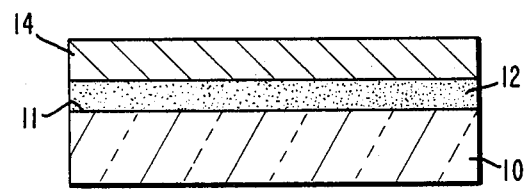

Then, as shown in FIG. 1b, a layer 14 of the first selected superconducting material, such as niobium or vanadium, is deposited to a predetermined thickness over the layer 12 of the chosen reactive material. The layer 14 of niobium may be deposited using known electron beam evaporation techniques as described, for example, in the book by Berry et al. referenced above. The layer 14 of niobium is typically deposited to a thickness of 2,000 angstroms or more.

The layer 12 shown in FIG. 1b reacts with the layer 14 upon deposition thereof, to form the composite layer 12', comprising the layers 16 and 18 discussed below. A portion of the layer 14 is consumed in this reaction so that the layer 14 is altered to form the layer 14' shown in FIG. 1c. Optionally, the reaction between the layers 12 and 14 may be enhanced by exposing the layers 12 and 14 to a laser beam.

The layer 12' shown in FIG. 1c serves as an interfacial reaction barrier to prevent the reaction between the substrate 10 and the first selected superconducting material of the layer 14 which would produce undesired non-superconducting materials or a low $T_c$ superconductor which degrades the low-temperature current transport properties at the interface at the surface 11 and thus degrades the current-voltage properties of the device subsequently formed. In addition, the layer 12' shown in FIG. 1c is itself a superconducting material and thus provides good current transport at the interface at the surface 11.

Figure 1C:
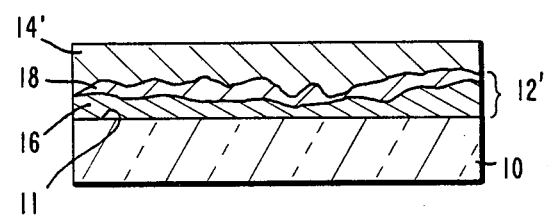

As illustrated in FIG. 1c, the layer 16, such as niobium carbide (NbC), is formed by the reaction of the chosen reactive material of the layer 12 of FIG. 1b, such as carbon, with the first superconducting material of the layer 14, such as niobium. Niobium carbide has a superconducting transition temperature $T_c = 12°$ K., whereas for Nb, $T_c = 9.2°$ K. Since the layer 16 comprises a superconducting material, the current transport properties at the interface at the surface 11 are maintained in an optimum state and thus the current-voltage characteristics of the device subsequently formed are also optimized. It has been determined that when the initial layer 12 has a thickness of approximately 40 angstroms, the layer 16 formed therefrom is laterally non-uniform as shown in FIG. 1c and has an average thickness of approximately 130 angstroms.

In addition, it has been determined that the laterally non-uniform layer 18, such as niobium silicide ($NbSi_2$), which is the reaction product of the substrate 10 and the first selected superconducting material of the layer 14 is also present, but is displaced relative to the substrate 10 and separated therefrom by the interposed layer 16 of superconducting material. It is believed that the non-superconducting $NbSi_2$ which forms is electrically innocuous since it does not directly contact the surface of the substrate 10 and is sandwiched between two superconductors, i.e. the layer 16 and the layer 14. In such a case, superconductivity is induced in the non-superconductor by the "proximity effect" provided that the layer of the non-superconductor is sufficiently thin.

Thus, by this first process embodiment of the present invention, a second superconducting material is formed between the substrate and the first superconducting material, to provide an optimized low temperature current transport path at the surface of the substrate. This interposed second superconductor layer serves as a chemically stable reaction barrier layer, both to separate any non-superconducting material formed from the substrate surface and to prevent further reaction at the substrate surface to form additional non-superconducting material. Consequently, spurious electronic states that permit unwanted currents to flow in the device subsequently formed are prevented. By providing an optimized current transport path at the substrate interface, the device performance is significantly improved. In particular, the voltage-state resistance of Josephson junction logic gates can be increased and the noise figure of super-Schottky mixers can be decreased by forming these devices by the process of the present invention.

Figure 2A:
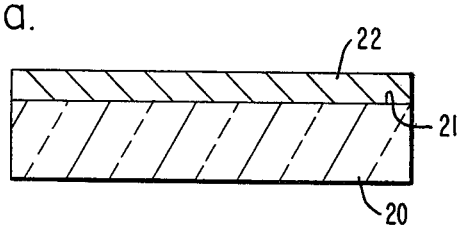
FIGS. 2a–b illustrate, in schematic form, some of the major steps in a second process embodiment of the present invention.
Figure 2B:
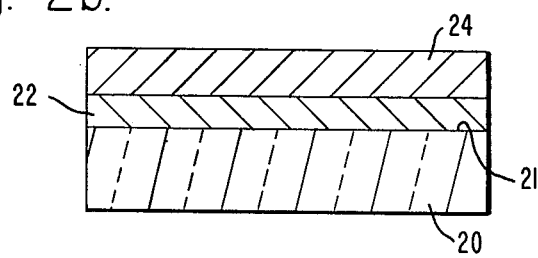

Turning now to FIG. 2, there are shown, in schematic form, some of the major steps in a second process embodiment of the present invention in which a first, auxiliary superconductor material layer is deposited on the substrate surface prior to the deposition of the major superconducting material of which the device is formed. A substrate 20 of a selected semiconductor material, such as silicon, in the form of an ultra-thin membrane, is provided with an atomically clean surface 21 as described in relation to the substrate 10 in FIG. 1a. Next, under ultra-high vacuum conditions which maintain the non-contaminating environment for the substrate 20, a layer 22 of a first selected superconducting material is deposited to a predetermined thickness on the surface of the atomically clean substrate 20, as illustrated in FIG. 2a. The layer 22 may be formed of niobium carbide (NbC), which is deposited to a thickness of approximately 100 angstroms by known sputter-deposition techniques as described, for example, in the publication entitled "Properties of Sputtered High $T_c$ Thin Films" by J. R. Gavaler, in the *Journal of Vacuum Science and Technology*, Vol. 12, 1975, p. 103 et seq., and references cited therein. Then, a layer 24 of a second selected superconducting material is deposited over the layer 22 of the first chosen superconducting material to a predetermined thickness, as illustrated in FIG. 2b. The layer 24 may be formed of niobium, which is deposited to a thickness of approximately 2,000 angstroms by electron beam evaporation techniques as described in relation to FIG. 1b.

Thus, by the second process embodiment of the present invention as illustrated in FIG. 2b, a layer of a first superconducting material is interposed between the substrate and the second superconducting material to provide an effective current transport path between the substrate 20 and the superconducting material 24, which, in turn, improves device performance and, in particular, current-voltage properties. In addition, the layer 22 of the first superconducting material serves as a reaction barrier to prevent contact and resulting reaction between the substrate 20 and the second superconducting material 24, which would produce undesired non-superconducting materials.

Figure 3A:
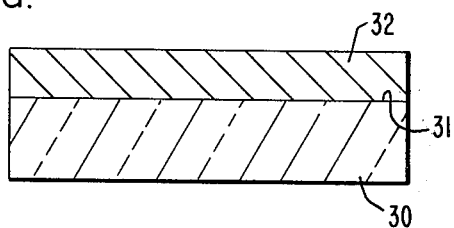
FIGS. 3a–b illustrate, in schematic form, some of the major steps in a third process embodiment of the present invention.
Figure 3B:
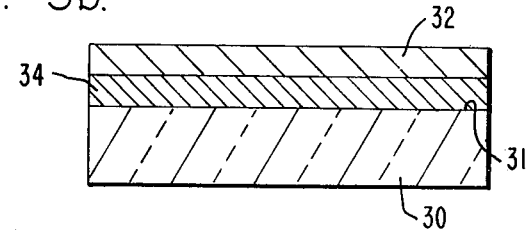

In FIG. 3 there are shown the major steps in a third process embodiment of the present invention in which the interface of the substrate and the first superconductor is altered to produce a layer of a second chosen superconducting material. A substrate 30 of a chosen semiconductor material, such as silicon, in the form of an ultra-thin membrane, is provided with an atomically clean surface as described in relation to the substrate 10 in FIG. 1a. Next, the layer 32 of a first chosen superconducting material is deposited on the surface of the substrate 30 to a predetermined thickness. The layer 32 may be formed of niobium which is deposited to a thickness of approximately 2,000 angstroms by electron beam evaporation techniques as discussed in relation to the formation of the layer 14 in FIG. 1b. Then, the interface 31 between the substrate 30 and the layer 32 of superconducting material is subjected to external perturbation, such as ion-bombardment or laser annealing, to cause the formation of the layer 34 of a desirable interfacial compound which has superconducting properties. For example, the interface region 31 may be bombarded with inert gas ions or silicon ions to introduce energy into the interface region 31 which is sufficient to cause the formation of the layer 34 of a second superconducting compound, rather than the non-superconducting compound which would be formed under ordinary conditions. If the substrate 30 is silicon and the layer 32 is niobium, ion bombardment could be used to cause the formation of superconducting $Nb_3Si$ instead of the non-superconducting $NbSi_2$ which would form under ordinary conditions. Optionally, the interface 31 may be exposed to a laser beam in order to provide sufficient energy thereto to cause the formation of the second superconducting material. The layer 34 need not necessarily be planar as shown in FIG. 3b, but may have a non-uniform thickness similar to that of the layer 16 shown in FIG. 1c.

As yet another option, the interface 31 may be implanted with selected ions, such as carbon, which are capable of reacting with the layer 32 of first superconducting material to form a layer of a second superconducting material, similar to the reaction described in relation to FIG. 1.

Thus, by this third process embodiment of the present invention, a layer of a second superconducting material is formed between the substrate and the first superconducting material to provide an effective current transport path between the substrate and the first superconducting material and to provide improved device performance. In addition, the layer of the interposed second superconducting material serves as an interfacial reaction barrier to prevent further reaction between the substrate and the first superconducting material which would otherwise form undesired non-superconducting products that would degrade the current transport properties of the device so formed.

Moreover, it is anticipated that the step of alterating the superconductor/semiconductor interface set forth in this third process embodiment of the present invention may be applied to superconductor/semiconductor junction structures formed by processes other than those described herein. An existing structure with a superconductor/semiconductor interface, such as a Nb/Si interface, would have undesired reaction products, such as $NbSi_2$, present at the interface. In accordance with the present invention, this interface would be altered either to convert the undesired product to a desirable superconducting material or to form an additional superconducting material at the interface which displaces the undesirable product from the interface.

Figure 4:
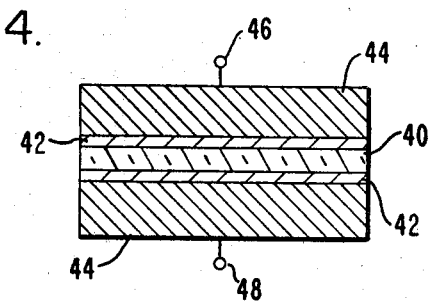
FIG. 4 illustrates, in schematic cross-section, a Josephson junction superconducting device formed in accordance with the process of the present invention.

FIG. 4 illustrates, in schematic form, a Josephson junction superconducting device formed by the process of the present invention. The device comprises an ultra-thin (e.g. 100 to 2,000 angstroms) membrane 40 of a chosen semiconductor material, such as silicon, on each side of which have been formed the layers 42 of a first chosen superconducting material, such as niobium carbide, to serve as an interfacial reaction barrier. On the exposed surface of each of the layers 42, there is formed a layer 44 of a second chosen superconducting material, such as niobium. To each of the layers 44, there is connected a contact means operative to derive an electrical output from the device and comprising, for example, standard ohmic contact means and wire leads, designated in FIG. 4 as 46 and 48 respectively. An insulator layer may be placed between the layer 44 and its associated contact means, as is known in the art and described, for example, by Kircher et al, previously referenced herein. It is understood that the required power inputs and control electrodes are provided as is known in the art of Josephson superconducting devices, for activating the device shown in FIG. 4.

The layers 42 may be formed by any of the process embodiments of the present invention described herein. The layers 44 may be formed of the same or different superconducting materials, with the corresponding layer 42 being chosen to meet the requirements specified herein for forming an interfacial reaction barrier.

The Josephson superconducting device shown in FIG. 4 and formed in accordance with the process of the present invention exhibits improved current-voltage properties as a result of the improved current transport path provided at the substrate surface by the process of the present invention. The Josephson superconducting device shown in FIG. 4 may be incorporated into an array of many such devices as is known in the art of Josephson junction devices and illustrated, for example, in Kircher et al, previously referenced herein.

Figure 5:
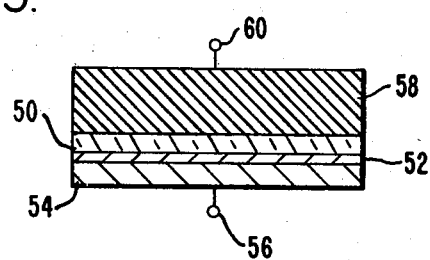
FIG. 5 illustrates, in schematic cross-section, a super-Schottky device formed in accordance with the process of the present invention.

FIG. 5 shows, in schematic form, a super-Schottky device formed in accordance with the process of the present invention. The device comprises, for example, an ultra-thin (e.g. 100 to 4,000 angstroms) membrane substrate 50 of a selected semiconductor material, such as silicon. In actual practice, the silicon substrate may be as thick as necessary to provide desired device performance for a super-Schottky device. On one major surface of the substrate 50 there is formed a layer 52 of a first selected superconducting material, such as niobium carbide. On the exposed surface of the first superconducting material 52, there is formed a layer 54 of a second selected superconducting material, such as niobium, to which there is connected a contact means, such as standard ohmic contact means and wire lead, designated in FIG. 6 as 56. The layer 52 of the first selected superconducting material may be formed by any of the alternative process embodiments of the present invention discussed herein. On the second major surface of the substrate 50 (opposite the layer 52), there is connected a second contact means comprising the layer 58 of a normal metal, for example, aluminum, and a wire lead 60 connected thereto. Both contact means are operative to derive an electrical output from the device. It is understood that the required power inputs and control lines are provided as is known in the art of super-Schottky devices for activating the device shown in FIG. 5.

The super-Schottky device formed by the process of the present invention has improved current-voltage characteristics as a result of the improved current transport properties provided at the substrate surface by the process of the present invention.

EXAMPLE 1

Example 1 illustrates the formation of a structure in accordance with one process embodiment of the present invention as described in relation to FIG. 1. The substrate 10 comprised [100] silicon which was 1 to 10 ohm-centimeters, n-type, P-doped, having dimensions of 0.5 inch on each side and a thickness of 1,000 to 1,800 angstroms. [The process described herein was also performed on [100] Si which was 5-11 ohm-centimeters, p-type, B-doped.] The substrate was cleaned by solvent degreasing, basic-peroxide and acidic peroxide solution cleaning, and deionized water rinsing. After cleaning, the samples were loaded into an ultra-high vacuum system which, after bake-out, achieved a base pressure of less than $10^{-8}$ Pa. Approximately 50 angstroms of the surface material of the substrate were removed by ion bombardment with 2 KeV argon ions incident at approximately 20° from the surface normal. The ion bombardment was followed by heating to approximately 800° C. for several minutes to expel implanted argon and restore the surface crystallinity. A film of carbon 10 to 40 angstroms thick was deposited on the cleaned silicon substrate surface by electron bombardment of a graphite hearth liner placed in one crucible of an electron beam evaporator. Auger analysis showed that the carbon films contained only approximately 5 percent oxygen as the sole impurity. Next, niobium was electron beam evaporated onto the nominally room temperature substrate placed six inches from the source. The thickness of the niobium layer was approximately 2,000 Å and at niobium deposition rates of approximately one angstrom per second, pressure in the vacuum chamber remained less than $7 \times 10^{-6}$ Pa. Auger depth-profile studies of the structure shown in FIG. 1c indicated that niobium carbide was the chemical state of the carbon in the structure being studied, as described in greater detail in our publication entitled "Interface Structure and Electrical Behavior of Nb/Si Junctions," previously referenced. In addition, it was further determined that $NbSi_2$ was present in the structure being studied, in spite of the interposed carbide layer. However, this silicide layer appeared to be displaced relative to the silicon substrate and separated from it by the interposed carbide layer. The average thickness of the carbide layer was determined to be approximately 130 angstroms.

EXAMPLE 2

This example illustrates the formation of a normal Schottky diode from the structure formed in Example 1 and the performance characteristics of such a device at room temperature. The structure formed in Example 1, having the configuration shown schematically in FIG. 1c, was processed by known photolithography and etching processes to form Schottky diodes with different diameters, having the structure shown in FIG. 5. Schottky barrier current-voltage measurements made at room temperature (i.e., 25° C.) on these diodes indicated that substantial interface modification resulted from reactions involving the carbon layer, and these results are discussed in greater detail in our publication entitled "Interface Structure and Electrical Behavior of Nb/Si Junctions," previously referenced herein.

Current-voltage characteristics were measured and the forward bias data were used to obtain barrier heights and n-factor. These studies indicated that the alteration of the chemical structure of the Nb/Si interface produced by interposing a carbon layer between the Nb and Si does, in fact, have a direct and positive effect on the normal (non-superconductive) current transport properties of this interface. It is expected that a similar beneficial effect on the electrical properties of the corresponding super-Schottky device can also be achieved by the process of the present invention.

While the present invention has been particularly described with respect to the preferred embodiments thereof, it will be recognized by those skilled in the art that certain other modifications in form and detail may be made without departing from the spirit and scope of the invention. In particular, the scope of this invention is not limited to the particular superconductor materials described herein, which were used merely as examples, but is intended to include any compound or elemental metal which exhibits the property of superconductivity. In addition, the present invention is not limited to the use of carbon or niobium carbide as the interfacial reaction barrier, which were used merely as examples, but includes the use of any chosen material which meets the requirements set forth herein for being itself or being able to form a superconducting material at the substrate surface. Moreover, it is not intended to limit the present invention to the particular semiconductor substrate material described herein, but to include any material which does not exhibit superconducting properties. In particular, the use of an interfacial reaction barrier of the type described herein may be beneficial in oxide barrier Josephson junction devices in which unwanted interfacial chemical reactions may also occur. In addition, the process of the present invention is not limited to the use of a thin silicon membrane as the substrate, which was used merely as an example, but is intended to include the formation of an interfacial reaction barrier between a superconductor and a semiconductor, regardless of the thickness of the semiconductor material. Further, the process of the present invention is not limited to the formation of the Josephson junction devices and super-Schottky devices described herein, but includes the formation of any structure in which a superconductor/non-superconductor interface occurs. Finally, it is not intended to limit the present invention to a single superconductor/semiconductor junction device as described herein, but to include structures comprising an array of many such devices.

What is claimed is:

1. A process for forming a superconductor/semiconductor junction structure having optimized low-temperature current transport properties comprising the steps of:

(a) providing a substrate of a chosen semiconductor material having an atomically clean surface;

(b) depositing on said clean surface of said substrate to a first predetermined thickness a layer of a chosen reactive material which is capable of undergoing an interfacial reaction with a first selected superconducting material to form a second selected superconducting material;

(c) depositing on said layer of said chosen reactive material a layer of said first selected superconducting material to a second predetermined thickness whereby said second superconducting material is formed by the reaction of said chosen reactive material with said first selected superconducting material and serves as an interfacial reaction barrier to prevent reaction between said surface of said substrate and said first selected superconducting material to form an undesired non-superconducting material that would degrade said current transport properties of said structure; and (d) providing contact means connected to said structure for deriving an electrical output therefrom.

2. The process set forth in claim 1 wherein:
(a) said substrate is formed of silicon and has a thickness in the range of 100 to 4,000 angstroms;
(b) said chosen reactive material is carbon and is deposited to a thickness of approximately 40 angstroms;
(c) said first selected superconducting material is niobium and is deposited to a thickness of approximately 2,000 angstroms;
(d) said second superconducting material formed by said reaction of said chosen reactive material with said first selected superconducting material is niobium carbide (NbC).

3. A process for forming a superconductor/semiconductor junction structure having optimized low-temperature current transport properties comprising the steps of:
(a) providing a substrate of a chosen semiconductor material having an atomically clean surface;
(b) depositing on said clean surface of said substrate a layer of a first selected superconducting material to a first predetermined thickness;
(c) depositing on said layer of said first selected superconducting material to a second predetermined thickness a layer of a second selected superconducting material which is capable of reaction with said semiconductor material of said substrate to form an undesirable non-superconducting material, whereby said layer of said first selected superconducting material serves as an interfacial reaction barrier to prevent said reaction between said surface of said substrate and said second selected superconducting material which would produce said undesirable non-superconducting material that would degrade said current transport properties of said structure; and (d) providing contact means connected to said structure for deriving an electrical output therefrom.

4. The process set forth in claim 3 wherein:
(a) said substrate is formed of silicon;
(b) said first selected superconducting material is niobium carbide (NbC);
said second selected superconducting material is niobium.

5. A process for forming a superconductor/semiconductor junction structure having optimized low-temperature current transport properties comprising the steps of:
(a) providing a substrate of a chosen semiconductor material having an atomically clean surface;
(b) depositing on said surface of said substrate a layer of a first chosen superconducting material to a first predetermined thickness, and forming a superconductor/substrate interface;
(c) altering said superconductor/substrate interface to cause the formation of a layer of a second chosen superconducting material therein, whereby said layer of said second chosen superconducting material prevents interaction between said substrate and said first chosen superconducting material which would form an undesirable non-superconducting region at said superconductor/substrate interface that would interfere with said optimized current transport properties of said structure; and
(d) providing contact means connected to said device for deriving an electrical output therefrom.

6. The process set forth in claim 5 wherein said altering comprises bombarding said superconductor/substrate interface with selected ions.

7. The process set forth in claim 6 wherein said selected ions are chosen from the group consisting of ions of an inert gas, ions of said semiconductor material, and ions of a chosen reactive material which is capable of undergoing an interfacial reaction with said first chosen superconducting material to form said second chosen superconducting material.

8. The process set forth in claim 6 wherein:
(a) said substrate is formed of silicon;
(b) said first chosen superconducting material is niobium;
said selected ions are silicon ions;
(d) said second chosen superconducting material is $Nb_3Si$.

9. The process set forth in claim 5 wherein said altering comprises exposing said superconductor/substrate interface to a laser beam to produce transient heating of said interface.

* * * * *